United States Patent
Chan

(10) Patent No.: US 12,339,739 B2
(45) Date of Patent: Jun. 24, 2025

(54) DATA AUTHENTICATION FOR DATA COMPRESSION

(71) Applicant: Kam Fu Chan, Hong Kong (CN)

(72) Inventor: Kam Fu Chan, Hong Kong (CN)

( * ) Notice: Subject to any disclaimer, the term of this patent is extended or adjusted under 35 U.S.C. 154(b) by 0 days.

(21) Appl. No.: 18/040,956

(22) PCT Filed: Oct. 13, 2020

(86) PCT No.: PCT/IB2020/059588
§ 371 (c)(1),
(2) Date: Feb. 7, 2023

(87) PCT Pub. No.: WO2022/079466
PCT Pub. Date: Apr. 21, 2022

(65) Prior Publication Data
US 2023/0273855 A1 Aug. 31, 2023

(51) Int. Cl.
G06F 11/10 (2006.01)
H03M 7/30 (2006.01)

(52) U.S. Cl.
CPC ....... *G06F 11/1004* (2013.01); *H03M 7/6011* (2013.01)

(58) Field of Classification Search
CPC .......................... G06F 11/1004; H03M 7/6011
See application file for complete search history.

(56) References Cited

U.S. PATENT DOCUMENTS

| | | | |
|---|---|---|---|
| 2009/0044230 A1* | 2/2009 | Oh | H04H 40/27 725/62 |
| 2011/0261813 A1 | 10/2011 | Baptist et al. | |
| 2012/0041931 A1* | 2/2012 | Ross | G06F 21/64 707/693 |
| 2014/0161195 A1* | 6/2014 | Karkkainen | H04N 19/94 375/240.01 |
| 2019/0132117 A1* | 5/2019 | Kuang | H04L 9/14 |
| 2021/0288662 A1* | 9/2021 | Fukazawa | H03M 7/40 |
| 2023/0020655 A1* | 1/2023 | Xu | H04L 9/3239 |

FOREIGN PATENT DOCUMENTS

| CN | 111611214 A | 9/2020 |
|---|---|---|
| WO | WO-2019079890 A1 | 5/2019 |

OTHER PUBLICATIONS

L. R. Knudsen and B. Preneel, "Error correcting codes and collision-resistant hashing," Proceedings of the 1999 IEEE Information Theory and Communications Workshop (Cat. No. 99EX253), Kruger National Park, South Africa, 1999, pp. 55-57. (Year: 1999).*
"International Application Serial No. PCT/IB2020/059588, International Search Report dated Jul. 14, 2021", (Jul. 14, 2021), 3 pgs.
"International Application Serial No. PCT/IB2020/059588, Written Opinion dated Jul. 14, 2021", (Jul. 14, 2021), 3 pgs.
"Data Compression", [Online]. Retrieved from the Internet: URL: http: web.archive.org web 20230206013007 https: en.wikipedia.org wiki Data_compression, (Feb. 6, 2023), 19 pgs.
"Cyclic redundancy check", [Online]. Retrieved from the Internet: URL: http: web.archive.org web 20221029113843en.m.wikipedia.org wiki Cyclic_redundancy_check, (Oct. 29, 2022), 18 pgs.
"Hash function", [Online]. Retrieved from the Internet: URL: http: web.archive.org web 20230125210334 en.m.wikipedia.org wiki Hash_function, (Jan. 25, 2023), 19 pgs.

* cited by examiner

*Primary Examiner* — Albert Decady
*Assistant Examiner* — Enamul M Kabir
(74) *Attorney, Agent, or Firm* — Schwegman Lundberg & Woessner, P.A.

(57) ABSTRACT

Methods and techniques for processing digital data whether random or not, within the scope of processing designed, through encoding and decoding losslessly and correctly for purposes of compression/decompression or both, using counted information and check-sum(s) with or without check-sum index or indices. A method includes encoding digital information composed of binary bits made up of one or both of bit 1 and bit 0, using header indicators, size of digital information under processing, one or more check-sums with or without check-sum index or indices where and when appropriate for data identification and authentication.

12 Claims, No Drawings

DATA AUTHENTICATION FOR DATA COMPRESSION

PRIORITY APPLICATIONS

This application is a U.S. National Stage Filing under 35 U.S.C. § 371 from International Application No. PCT/IB2020/059588, filed on Oct. 13, 2020, and published as WO2022/079466 on Apr. 21, 2022; the benefit of priority of which is hereby claimed herein, and which application and publication are hereby incorporated herein by reference in its entirety.

TECHNICAL FIELD

Let him that hath understanding count the number . . . .

Through the use novel method of Data Authentication For Data Compression (DADC) revealed here, one is able to manipulate and make coding (including encoding and decoding) of any digital information for the purpose of lossless compression and its corresponding decompression for correct restoration of the original digital information, whether random or not, for the use and protection of intellectual property, expressed in the form of digital information, including digital data as well executable code for use in device(s), including computer system(s) or computer-controlled device(s) or operating-system-controlled device(s) or system(s) that is/are capable of running executable code or using digital data. Such device(s) is/are mentioned hereafter as Device(s).

In particular, this invention, DADC, relates to the use of the corresponding techniques elaborated below for its application in processing, storing, distribution and use in Device(s) of digital information, including digital data as well as executable code, such as boot code, programs, applications, device drivers, or a collection of such executables constituting an operating system in the form of executable code embedded or stored into hardware, such as embedded or stored in all types of storage medium, including read-only or rewritable or volatile or non-volatile storage medium (referred hereafter as the Storage Medium) such as physical memory or internal DRAM (Dynamic Random Access Memory) or hard disk or solid state disk (SSD) or ROM (Read Only Memory), or read-only or rewritable CD/DVD/HD-DVD/Blu-Ray DVD or hardware chip or chipset etc. The method of coding revealed, i.e. DADC, when implemented produces an encoded code that could be decoded so that the original digital information could be restored losslessly and correctly; such coding is meant particularly for compression, and such compressed code could also be re-compressed time and again until it reaches its limit.

In essence, this invention reveals the use of the counting technique, the technique of detecting check-sum collision and data authentication technique together for the purpose of making compression/decompression of digital information. In this relation, it makes possible the processing, storing, distribution and use of digital information in Device(s) connected over local clouds or internet clouds for the purpose of using and protecting intellectual property. As with the use of other compression methods, without proper decompression using the corresponding methods, the compressed code could not be restored correctly back into the original digital information. This method and the resultant product, the codes and code files, so produced could also be used in other scientific, industrial and commercial endeavors in various kinds of applications to be explored. The use of it in the Compression Field demonstrates vividly its tremendous use.

The product produced using this method is not limited to delivery or exchange of digital information over clouds, i.e. local area network or internet, but could be used in other modes of delivery or exchange of information.

BACKGROUND ART

In the field of Compression Science, there are many methods and algorithms published for compressing digital information and introduction to commonly used data compression methods and algorithms could be found at http://en.wikipedia.org/wiki/Data_compression.

The present invention describes a novel method that could be used for making lossless data compression (besides also being suitable for use for the purpose of making encryption and losslessly decryption) and its restoration. Relevant part of the aforesaid wiki on lossless compression is reproduced here for easy reference:

"Lossless data compression algorithms usually exploit statistical redundancy to represent data more concisely without losing information, so that the process is reversible. Lossless compression is possible because most real-world data has statistical redundancy. For example, an image may have areas of colour that do not change over several pixels; instead of coding "red pixel, red pixel, . . . " the data may be encoded as "279 red pixels". This is a basic example of run-length encoding; there are many schemes to reduce file size by eliminating redundancy.

The Lempel-Ziv (LZ) compression methods are among the most popular algorithms for lossless storage.[6] DEFLATE is a variation on LZ optimized for decompression speed and compression ratio, but compression can be slow. DEFLATE is used in PKZIP, Gzip and PNG. LZW (Lempel-Ziv-Welch) is used in GIF images. Also noteworthy is the LZR (Lempel-Ziv-Renau) algorithm, which serves as the basis for the Zip method. LZ methods use a table-based compression model where table entries are substituted for repeated strings of data. For most LZ methods, this table is generated dynamically from earlier data in the input. The table itself is often Huffman encoded (e.g. SHRI, LZX). A current LZ-based coding scheme that performs well is LZX, used in Microsoft's CAB format.

The best modern lossless compressors use probabilistic models, such as prediction by partial matching. The Burrows-Wheeler transform can also be viewed as an indirect form of statistical modelling.[7]

The class of grammar-based codes are gaining popularity because they can compress highly repetitive text, extremely effectively, for instance, biological data collection of same or related species, huge versioned document collection, internet archives, etc. The basic task of grammar-based codes is constructing a context-free grammar deriving a single string. Sequitur and Re-Pair are practical grammar compression algorithms for which public codes are available.

In a further refinement of these techniques, statistical predictions can be coupled to an algorithm called arithmetic coding. Arithmetic coding, invented by Jorma Rissanen, and turned into a practical method by Witten, Neal, and Cleary, achieves superior compression to the better-known Huffman algorithm and lends itself especially well to adaptive data compression tasks where the predictions are strongly context-dependent. Arithmetic coding is used in the bi-level image compression standard JBIG, and the document compression standard DjVu. The text entry system Dasher is an inverse arithmetic coder.[8]"

In the aforesaid wiki, it says that "LZ methods use a table-based compression model where table entries are substituted for repeated strings of data". The use of table for translation, encryption, compression and expansion is common but how the use of table for such purposes are various and could be novel in one way or the other.

The present invention, DADC, presents a novel method that produces amazing result that has never been revealed elsewhere. This represents a successful challenge and a revolutionary ending to the myth of Pigeonhole Principle in Information Theory. It demonstrates how the technical problems described in the following section are being approached and solved.

DISCLOSURE OF INVENTION

Technical Problem

The technical problem presented in the challenge of lossless data compression is how longer entries of digital data code could be represented in shorter entries of code and yet could be recoverable. While shorter entries could be used for substituting longer data entries, it seems inevitable that some other information, in digital form, has to be added in order to make it possible or tell how it is to recover the original longer entries from the shortened entries. If too much such digital information has to be added, it makes the compression efforts futile and sometimes, the result is expansion rather than compression.

The way of storing such additional information presents another challenge to the compression process. If the additional information for one or more entries of the digital information is stored interspersed with the compressed data entries, how to differentiate the additional information from the original entries of the digital information is a problem and the separation of the compressed entries of the digital information during recovery presents another challenge, especially where the original entries of the digital information are to be compressed into different lengths and the additional information may also vary in length accordingly.

This is especially problematic if the additional information and the compressed digital entries are to be recoverable after re-compression again and again. More often than not, compressed data could not be re-compressed and even if re-compression is attempted, not much gain could be obtained and very often the result is an expansion rather than compression.

The digital information to be compressed also varies in nature; some are text files, others are graphic, music, audio or video files, etc. Text files usually have to be compressed losslessly, otherwise its content becomes lost or scrambled and thus unrecognizable.

And some text files are ASCII based while others UNICODE based. Text files of different languages also have different characteristics as expressed in the frequency and combination of the digital codes used for representation. This means a method which has little adaptive power (i.e. not being capable for catering for all possible cases) could not work best for all such scenarios. Providing a more adaptive and flexible method for data compression is therefore a challenge.

Technical Solution

Disclosed herein is a computer-implemented method for processing digital data, including random data, through encoding and decoding the data correctly and losslessly for the purpose of compression/decompression. It can be used for lossless data compression and restoration of the compressed code back into the original digital data. The method makes no assumptions regarding digital data to be processed before processing the data.

It has long been held in the data compression field that pure random binary numbers could not be shown to be definitely subject to compression until the present invention and the other two inventions, CHAN FRAMEWORK, CHAN CODING AND CHAN CODE as revealed in PCT/IB2017/054500 and DIGITAL LENSING as revealed in PCT/IB2018/055479 also by the present inventor. By providing another novel coding method for lossless compression that suits to digital information, whether random or not, of different types and of different language characteristics, the present invention, DADC, enables one to compress random or non-random digital information and to recover it successfully. This puts an end to the myth of Pigeonhole Principle in Information Theory. Of course, there is a limit. This is obvious that one could not further compress a digital information of only 1 bit. The limit of compressing digital information as revealed by the present invention varies with the size of the original digital information as well as the size of check-sum(s) or hash code(s) used for data authentication.

Before this invention, check-sum or hash code has long been used for checking data integrity for detecting whether errors have been introduced in the course of data transmission over electronic digital network or if the data has been tampered with in whatever way. For check-sum and hash code (hereafter check-sum stands for or is used to substitute for check-sum and/or hash code in general; if using specifically, they will be preceded by their industry standard names), the following two wiki links give an introductory overview and some of the relevant paragraphs are extracted below for reference:

https://en.m.wikipedia.org/wiki/Cyclic_redundancy_check

"A cyclic redundancy check (CRC) is an error-detecting code commonly used in digital networks and storage devices to detect accidental changes to raw data. Blocks of data entering these systems get a short check value attached, based on the remainder of a polynomial division of their contents. On retrieval, the calculation is repeated and, in the event the check values do not match, corrective action can be taken against data corruption. CRCs can be used for error correction.

CRCs are so called because the check (data verification) value is a redundancy (it expands the message without adding information) and the algorithm is based on cyclic codes. CRCs are popular because they are simple to implement in binary hardware, easy to analyze mathematically, and particularly good at detecting common errors caused by noise in transmission channels. Because the check value has a fixed length, the function that generates it is occasionally used as a hash fuction."

https://en.m.wikipedia.org/wiki/Hash_function

"A hash function is any function that can be used to map data of arbitrary size to fixed-size values. The values returned by a hash function are called hash values, hash codes, digests, or simply hashes.

A hash function takes an input as a key, which is associated with a datum or record and used to identify it to the data storage and retrieval application. The keys may be fixed length, like an integer, or variable length, like a name. In some cases, the key is the datum itself. The output is a hash code used to index a hash table holding the data or records, or pointers to them.

A hash function may be considered to perform three functions:

Convert variable length keys into fixed length (usually machine word length or less) values, by folding them by words or other units using a parity-preserving operator like ADD or XOR.

Scramble the bits of the key so that the resulting values are uniformly distributed over the key space.

Map the key values into ones less than or equal to the size of the table.

A good hash function satisfies two basic properties: 1) it should be very fast to compute; 2) it should minimize duplication of output values (collisions)."

From the above, it could be seen that before the present invention, check-sum has only been customarily used for checking data integrity as it does not contain all the information of the original digital information. What is more, there are chances of duplication causing check-sum collision. So there has been no way of restoring the original digital information by using simply check-sum alone in the conventional way.

The present invention presents a novel method of solving the technical problems of using check-sum for restoration of the original digital information from it. Using this method, the distribution pattern of the random or non-random digital information to be compressed and recovered need not be known beforehand. That means it suits for all types of digital data distribution, expressed in the form of a series of binary bits made up of bit 1 and/or bit 0. However, for the purpose of compression of data, the size of the digital information under processing measured and expressed in terms of a certain number of binary bits composed of bit 1 and/or bit 0 should be bigger than that of the check-sum(s) used plus the number of binary bits used for expressing the number of binary digital bits of the digital information under processing and plus a certain number of binary bits used as header indicators for the data encoder or decoder to know how to manipulate the aforesaid digital binary bits for compression and decompression purpose.

The novel method presented here includes the following techniques:

(1) technique of counting and expressing, that is, counting the decimal number of digital binary bits of the original digital information made up of bit 1 and/or bit 0 and expressing this decimal number using binary bits of another numeral system of choice (in the form of base conversion of numeral system), such as base-2 (binary numeral system), base-16 (hexadecimal numeral system) or the like considered appropriate to the purpose of encoding for compression as well as decoding for decompression for lossless and correct restoration of the original digital information;

(2) technique of generating the necessary check-sum(s) required by the purpose of (1) above;

(3) technique of checking for any check-sum collisions; and (4) technique of data authentication, making sure the data to be encoded and decoded is corresponding to the original digital information;

The technique of counting and expressing mentioned in Paragraph [18](1) is further explained here. Customarily check-sum could not be used for correct restoration of the original digital information from which it is derived; this is so because certain information has been lost, the most important of which is the size of the original digital information, measured in terms of the decimal number of binary bits composed of bit 1 or bit 0. So by supplying this piece of information, the original digital information could be restored correctly subject to there being no check-sum collisions as well as to the original digital information being correctly authenticated.

The 55$^{th}$ edition of the TOP500 reported, as of June 2020, "the new top system, Fugaku, turned in a High Performance Linpack [HPL] result of 415.5 petaflops, besting the now second-place Summit system by a factor of 2.8x." (For reference, please go to visit https://www.top500,org/lists/top500/2020/06/). With the advent of these Supercomputer systems and the revelation of the present invention, the problem of check-sum collision and data authentication could easily be solved.

Since using the technique of Paragraph [18](1), the decimal number of binary bits composed of bit 1 and/or bit 0 is counted and known. Using the base-2 binary numeral system for expressing such decimal number, the saving in bit storage is tremendous, for instance, up to 1,048,576 binary bits (counted using decimal numeral system) of bit 1 and/or bit 0 could be expressed in 20 binary bits using the base-2 binary numeral system.

However, upon decoding, another piece of information is required; that is the number of binary bits using the base-2 binary numeral system representing the decimal number of binary bits composed of bit 1 and/or bit 0 of the original digital information. So this means the technique of Paragraph [18](1) has to be used once again. At this point, the range of the scope of the size of the original digital information to be compressed has to be taken into account (the scope of processing). If it is considered that digital information of less than 128 decimal binary bits (of bit 1 and/or bit 0, hereafter omitted for sake of brevity) is too small to be catered for, than one could assume the original digital information to be processed is more than 128 decimal binary bits of digital information, so 8 binary bits using base-2 numeral system is enough for representing 129 decimal binary bits up to 256 decimal binary bits; and along the same line, 9 binary bits using base-2 numeral system is enough for representing 257 decimal binary bits up to 512 decimal binary bits, etc etc. Actually, 8 binary bits using base-2 numeral system could in fact represent from 1 decimal binary bit to 256 binary bits and that portion of digital information from 1 decimal binary bit to 128 decimal binary bits is spared from use; and this could apply to 9 binary bits using base-2 numeral system, sparing the use of the portion of digital information from 1 decimal binary bit to 256 decimal binary bits, etc etc. In this example, 128 decimal binary bits of digital information is considered too small and not included in the scope of processing, the upper limit of the scope of processing has also be specified. If the number of binary bits using the base-2 binary numeral system is taken to be five binary bits, it has 32 unique values; and if the first unique value represents 8 decimal binary bits, the biggest unique value is 39, representing 39 decimal binary bits, which in turn represents 2 to the power of 39=5.497558e11 decimal binary bits of digital information. And this figure is already an astronomical figure and a file containing decimal binary bits of such astronomical figure of digital information is already beyond the the handling capacity of the operating systems at present. So 5 binary bits using the base-2 binary numeral system representing the decimal number of binary bits using the base-2 binary numeral system (which in turn represents the decimal number of binary bits to be processed) could be taken to acceptable for use. So upon decoding, in this example, 5 binary bits are first read and then this 5 binary bits of base-2 binary numeral system is converted into the number of binary bits using the base-2 binary numeral system representing the decimal number of binary bits of the digital information to be processed. For instance, if after this conversion, it is found that it is 5 bits of bit 0, 00000, which is equalivent to 8 binary bits. So an additional 8 binary bits have to be read and then its 8 binary bit value, such as 11111111, is in turned converted into the decimal number of binary bits of the digital information to be processed. The value of 11111111 when converted is equivalent to 256 (in decimal) binary bits used for representing the original digital information that has been encoded. If the value of the aforesaid 8 binary bits is 10000000, then after conversion (assuming the smallest value is 00000000) it means the original digital information has a size of 129 (in decimal) binary bits. It is to be noted here that as said earlier the portion of values from 1-128 bits, that is from 00000000 to 01111111 is left unused. If this is considered not desirable, this waste of space could be eliminated through adjustment of design of the above scheme of counting and expressing. However, the saving is just 1 binary bit per compression of digital information.

As said if the aforesaid 8 binary bits has a value of 10000000, it means the original digital information has 129 binary bits. And this 129 binary bits of digital information under processing have 2 to the power of 129=6.805647e38 unique patterns of bit 1 and/or bit 0 in permutation. The unique bit pattern of the digital information, one out of the 6.805647e38 possible patterns in permutation is lost and has to be identify. The present invention provides a novel method for such identification by using check-sum(s) that is//are derived from the digital information under processing.

The missing piece of information about the digital information under processing is the unique bit pattern of the binary bits making up the digital information under processing since its size, i.e. the decimal number of the binary bits making it up is already counted and known. So the technique mentioned in Paragraph [18](2) of generating the necessary check-sum(s) for the digital information under processing is required for providing this missing piece of information. It should be noted here that the purpose of using checksum(s) here changes from the customary use of it for checking data integrity to checking data identity in addition to data integrity. The types of Check-sum standards used should also be specified for the encoding and decoding purposes.

CRC checksum(s), SHA256 and SHA512 are industrial standards for checking data integrity. There are also other similar checking standards such as MD5 and the like. All these standards could be used and they are freely available in the form of some open source programming libraries as routines that could be used by persons skilful in the art. People could also develop their own similar checking methods for use.

CRC gives a standard 32 bit check-sum, where SHA256 256 bit hash code and SHA512 512 bit hash code. So one could use any one of which alone or in combination for checking data identity or for data authentication. Checking data identity or data authenitication involves two steps:

(1) checking for check-sum collision(s): given a particular size of the digital information under processing (measured in terms of the decimal number of the binary bits, in the form of bit 1 or bit 0, making up the digital information under processing), check if there are duplicate or multiple identical check-sums or hash codes generated for all the unique bit patterns of that size of digital information; i.e. if the size of digital information is 129 bits, all the unique bit patterns of the 129 bit size of digital information in permutation amounts to 6.805647e38 unique bit patterns; so for checking check-sum collision, the first step is to generate one check-sum for each of all the unique bit patterns of digital information of that size, there must be one which belongs to the digital information under processing; however, if there are other duplicate or multiple check-sum(s) generated from all other unique bit patterns of the digital information of that size which is/are identical to the one that is under processing, then there is check-sum collision; and if check-sum collision is found, it could be solved by step two below:

(2) data authentication, this is the step that is performed after identical duplicate or multiple check-sums are found using step one above; this step is to generate one or more check-sum(s) or hash code(s) other than that one based on the unique bit pattern composed of all the binary bits of the digital information under processing already described (for instance, using different standards for generating such other check-sum(s)) based on also the unique bit pattern composed of all the binary bits of the digital information under processing or based on the bit pattern(s) of one sub-set or more sub-sets of all the binary bits of the digital information under processing (for instance, such as using all the odd binary bits as one sub-set and using all the even binary bits as another sub-set; and in this case the check-sum(s) generated could be using the same standard or different standards as appropriate) for further data authentication purpose. Check-sum Index could also be used for such purpose. (Please refer to Paragraph [38] for further explanation on the use of Check-sum Index.)

It could be logically deduced that for a given size of digital information under processing, generating a check-sum for the unique bit pattern of all the binary bits of the digital information under processing (i.e. ALLBIT-check-sum) together with generating other check-sums for one sub-set using all the odd binary bits (i.e. ODDBIT-check-sum) and for another sub-set using all the even binary bits (EVENBIT-check-sum) of all the binary bits of the digital information under processing for data authentication could completely eliminate the possibility of having check-sum collision. This is so because the authenticity of the digital information under processing is vindicated by the exact match of the following four pieces of information: the size of the digital information, ALLBIT-check-sum, ODDBIT-check-sum and EVENBIT-check-sum. There should only be one piece of digital information of a given size of a unique bit pattern that matches all these three check-sums. However, it does not mean that this is the only combination of size and check-sums of the whole set and the sub-sets arrangement that could achieve the purpose of data authentication; other arrangements or combinations could be tried out.

Using the above method and techniques, all digital information of any size of any unique bit patterns could be compressed subject to the limit that the size of the digital information under processing must be bigger than that of the check-sum(s) used plus the number of binary bits used for expressing the size of the number of binary digital bits of the digital information under processing and plus a certain number of binary bits used as header indicators for the data encoder or decoder to know how to manipulate the aforesaid digital binary bits for compression and decompression purpose.

All in all, the conclusion is again:
Let him that hath understanding count the number . . .

Advantageous Effects

Any digital information, including random or non-random patterns of distribution of bit 1 and/or bit 0 making it up, could be compressed subject to the limit described above. In the present days of the era of information explosion, method that enables compression of digital data, random or not in distribution, makes a great contribution to the whole mankind making use of and relying on exchange and storage of digital data in every aspect of life. It surely could also contribute to the effort of man-space exploration or resettlement.

Best Mode

Suppose CRC check-sum of 32 bit is used for data authentication. For any particular size of digital information, if it is found that there is no duplicate or multiple identical check-sums generated for all its unique bit patterns of all the binary bits of the digital information, then only one 32-bit CRC check-sum is enough for correctly identifying any unique values of the digital information of that particular size as distinct from each other; and if that particular size is bigger than 32 bits, then there should be saving of bit storage and is amenable to compression. Of course, the steps of Paragraph [18](1), (2) and (3) have to be done for any chosen particular size of digital information before the conclusion could be drawn for that particular size. Afterwards, as this is known by such checking and such checking need only be done once, it could then be taken for granted as an inherent logic and conclusion that could be used for encoding for that particular size of digital information. Such logic could be built into encoder and decoder for use.

Assuming that particular size is 64 bits, then 32 bits are saved for each piece of digital information of 64 bits. The saving achieved is 50 percent regardless the bit patterns of that particular size assuming all the unique bit patterns of digital information of 64 bit size each a piece have no duplicate or multiple identical CRC check-sums. So the best mode of implementing the present invention is to find out any particular size of digital information for which there are no duplicate or multiple identical check-sums for all its unique bit patterns made up of all its binary bits in permutation by performing the techniques of Paragraph [18](1), (2) and (3), this size being No Collision Size; and then use the technique of Divide and Conquer strategy for processing for making compression as explained in the following Paragraph [33].

The technique of Divide and Conquer strategy is to break down any particular digital information of a size bigger than No Collision Size into sub-sections each of which is of No Collision Size for encoding for compression and the corresponding decoding process for decompression. The encoding is then simply to generate a check-sum of choice for each of the sub-sections of digital information of No Collision Size so divided. When it comes to the end of any digital information the last sub-section of binary bits does not make up to the size of No Collision Size, such binary bits, if any, could be left as they are without having to be encoded, thus as the last un-encoded sub-section. And in the header of the encoded file, 1 binary bit could be used for specifying if the last sub-section is an un-encoded sub-section in case the size of that sub-section equals to the size of the check-sum generated corresponding to that sub-section of digital information of No Collision Size. In this case, the header indicator for this purpose uses only 1 bit; this is the Un-encoded Sub-section Bit (USB). Other header indicator(s), such as Recycle Bit (RB, specifying on each cycle of compression if it is to stop or continue to make compression for another cycle of compression; this bit is also used by the decoder for decompression) or Compression Cycles Bits (CCB, specifying only once in the file header that the content code has to undergo or has been undergone how many cycles of compression for the purpose of compression or decompression) could be added; for example, if the compressed code is to be re-compressed again and again until the compressed code reaches its limit, i.e. the size of compressed code equivalent to at least one No Collision Size plus header indicators used.

If No Collision Size is not found either because the procedure of checking for no collision is not done for any of the size of digital information or if it is done but found that there are duplicate or multiple identical check-sums for all sizes of digital information for which the procedure of checking for no collision has been used, the best mode of implementing the present invention is to use the technique of Divide and Conquer described in Paragraph [33], i.e. to subdivide the digital information under processing into sub-sections of a size that is bigger than all the check-sums used for a sub-section (the resultant bit storage saving as a whole should be bigger than the bit expenditure used by header indicators used if any); and then for each of these sub-sections, to generate all three types of check-sums: ALLBIT-check-sum, ODDBIT-check-sum and EVENBIT-check-sum (or similar hash codes for the same purpose) and to use them to represent the corresponding sub-sections of the digital information under processing as described in Paragraph [27]. This guarantees the digital information under processing is correctly authenticated without any ambiguity.

Assuming CRC standard is used for generating ALLBIT-check-sum, ODDBIT-check-sum and EVENBIT-check-sum for a sub-section of a digital information, it adds up to 32*3=96 bits. So any digital information divided into sub-sections bigger in size than 96 bits (after discounting the bit expenditure of header indicators used) could be compressed. So for instance, a sub-section of 128 bits of digital information after compression, i.e. being represented by its corresponding ALLBIT-check-sum, ODDBIT-check-sum and EVENBIT-check-sum could yield of 128-96=32 bits of saving in bit storage.

Mode for Invention

When more than one is used, the check-sums (or hash codes) used for data authentication could be generated using different industrial standards, such as CRC mixing with SHA256 or SHA512; or SHA256 mixing with SHA512 in different combination and placed in different order as appropriate. Header indicators could be used for specifying such information, such as Bits for Types of Check-sum(s) Generated and Bit(s) for Number of Check-sum(s) Used.

Furthermore, in the above revelation, two scenarios are discussed, one using one check-sum the other three check-sums for data authentication. However, one could do more investigation for any different sizes of digital information to find out the patterns of duplicate or multiple identical check-sums corresponding to each of the sizes of digital information under investigation. For some digital information sizes, the duplicate or multiple identical check-sums for the same size are less and for some more. For those sizes with not too many duplicate or multiple identical check-sums, using three check-sums, such as ALLBIT-check-sum, ODDBIT-check-sum and EVENBIT-check-sum may not be necessary in order to save more bit storage space for the digital information under processing. In such cases, two check-sums may be enough. Which two of ALLBIT-check-sum, ODDBIT-check-sum and EVENBIT-check-sum are used are subject to design as well as to the investigation result of the picture of the duplication or multiplication of identical check-sums about each of the different unique bit patterns of the digital information of the sizes that are under investigation. The bottom line is the check-sums used should clearly authenticate the digital information under processing and the total number of binary bits of check-sums plus header indicators used be less than that used by the digital information under processing for the purpose of data compression.

For any size of digital information under processing for which it is found out that there are just a few duplicate or multiple identical check-sums for each or some of all the unique bit patterns of the digital information under processing, there is another alternative, another novel technique for data authentication, that is creating a Check-sum Index (CI) for the check-sum used in order to distinguish duplicate or multiple identical check-sums from each other that are corresponding to different unique bit patterns of the same size of the digital information under processing. CI, using, for instance, say, base-2 numeral system as described above could be put in front of the check-sum used or appended to the check-sum at the back or at a position in the same digital file as the main body containing the check-sums and the header indicators or even in a separate digital file as considered appropriate according to design. In that case, one should find out the maximum value and the lowest limit of the number of duplication or multiplication of identical check-sums for that particular size of the digital information under processing for determining the range of the number of binary bits used for the CI used for its representation in base-2 numeral system. As with the use of check-sum(s), Header indicators could be used for specifying such information such as Number of Binary Bits Used By Check-sum Index for each check-sum used.

Using the Divide and Conquer technique as revealed in Paragraph [33], the expressing of the size of the sub-section of the digital information under processing could also use header indicator for that purpose, however it could be expressed in the encoding logic of the program for encoding for compression and for decomposing. The counting of the actual size of the digital information under processing could be achieved by the way of using header indicator indicating if the last sub-section of the digital information under processing is an Un-encoded Sub-section or not where appropriate as explained in Paragraph [33] also. This is so because counting the number of the units of binary bits used by all the check-sums with or without check-sum index or indices representing each sub-section of the digital information under processing could give the number of sub-sections, including the un-encoded code section if any, divided out of the digital information under processing. And from this the size of the digital information under processing is known.

As said with putting CI into separate digital file(s) for storage, other components of the encoded digital information, as described above, including header indicator(s), check-sum(s) as well as the counting information for the scope size of the digital information under processing expressed in binary bits and the size of the digital information under processing in base-2 numeral system could also be separately put into different digital files for storage as appropriate subject to that the bit storage saving is sufficient to more than cover the bit expenditure required for separating these components into different digital files so that data compression could still be achieved.

So in essence, embodiments of the present invention are characterized by:

(1) for the purpose of data compression, a method of encoding digital information composed of binary bits made up of bit 1 and/or bit 0, using header indicators, size of digital information under processing, one or more check-sums with or without check-sum index or indices where and when appropriate for data identification and authentication;

(2) for the purpose of data compression, a method of decoding digital information composed of binary bits made up of bit 1 and/or bit 0, using header indicators, size of digital information under processing, one or more check-sums with or without check-sum index or indices where and when appropriate for data identification and authentication;

(3) the method of encoding for data compression uses techniques of:

the encoder, i.e. the program or application designed and made for the encoding process, on running counting the size of the digital information under processing measured in terms of the decimal number of binary bits, i.e. in the form of a series of bit 1 and/or bit 0 within the scope of processing according to design;

the encoder on running representing the counted size of the digital information under processing, in the form of encoded code of binary bits of base-2 numeral system or the like, using base conversion resulting in saving in bit storage and putting the encoded code into corresponding digital file if such information has not been embedded in the encoder;

the encoder on running, according to the scope of processing designed for the range of size of digital information under processing, representing the range of size using binary bits of base-2 numeral system or the like as encoded code and putting the encoded code into corresponding digital file if such information has not been embedded as program logic in the encoder;

the encoder on running for purpose of data identification and data authentication generating one or more check-sums or check-sum(s) together with Check-sum Index or Check-sum Indices if used where and when appropriate for the whole digital information under processing or for each of the sub-sections divided out of and making up the whole digital information under processing; and putting such check-sum(s) or check-sum(s) together with Check-sum Index or Check-sum Indices if used (and for the latter case where the whole digital information is divided into sub-section(s) also putting any binary bits, which are smaller than the size of a sub-section, left un-encoded making up the Un-encoded Section and generating the corresponding header indicator for it where and when appropriate) as encoded code, which is then put into the corresponding digital file(s) for the encoding process as appropriate and according to design;

the encoder on running generating one or more header indicators of the following, including Un-encoded Sub-section Bit, Recycle Bit, Compression Cycles Bits, Bits for Types of Check-sum(s) Generated, Bit(s) for Number of Check-sum(s) Used, Number of Binary Bits Used By Check-sum Index for each check-sum used as appropriate for use and putting such indicator(s) as encoded code, which is then put into corresponding digital file(s) if such information has not been embedded in the encoder as appropriate and according to design;

(4) the method of decoding for data decompression uses techniques of:

the decoder, i.e. the program or application designed and made for the decoding process, on running retrieving the scope of processing for the range of size of digital information under processing from the corresponding digital file or from program logic;

the decoder on running reading the represented size of the digital information under processing from the corresponding digital file or retrieving it from program logic, converting the represented size of the digital information under processing into counted size for use if necessary or appropriate;

the decoder on running for the purpose of data identification and data authentication retrieving, from the corresponding digital file(s), one or more check-sums or check-sum(s) together with Check-sum Index or Check-sum Indices if used where and when appropriate for the whole digital information under processing or for each of the sub-sections divided out of and making up the whole digital information under processing;

the decoder on running retrieving, from the corresponding digital file(s) or from program logic, header indicators, including Un-encoded Sub-section Bit, Recycle Bit, Compression Cycles Bits, Bits for Types of Check-sum(s) Generated, Bit(s) for Number of Check-sum(s) Used, Number of Binary Bits Used By Check-sum Index for each check-sum used as appropriate;

the decoder on running converting the retrieved piece(s) of digital information and restoring them back into the corresponding piece(s) of the original digital information as it is before the encoding process by, for purpose of data identification and data authentication, generating according to the header indicators indicating, one or more check-sums or check-sum(s) together with Check-sum Index or Check-sum Indices if used where and when appropriate for each of the unique bit patterns of the size of digital information corresponding to that particular size of the whole digital information under processing or for each of the unique bit patterns of the size of digital information corresponding to that particular size of the sub-sections divided out of and making up the whole digital information under processing; and then identifying the one which has exact match of check-sum(s) with or without check-sum index or indices corresponding to the corresponding unique bit pattern of the retrieved digital information for the authentication of the whole digital information under processing or identifying the one which has exact match of check-sum(s) with or without check-sum index or indices corresponding to the unique bit pattern of each of the sub-sections divided out of and making up the whole digital information under processing for the authentication of each of the corresponding sub-sections; and putting the corresponding unique bit pattern of the whole digital information with exact match under processing or the corresponding unique bit pattern of each of the sub-sections divided out of and making up the whole digital information with exact match under processing (and for the latter case, putting also any binary bits left un-encoded in the Un-encoded Section as indicated by the corresponding header indicator where and when appropriate) as decoded code into corresponding digital file(s) according to design;

(5) the encoded code for data compression produced by the encoding method revealed in (3) above;

(6) the digital file(s) containing the encoded code for data compression produced by the encoding method revealed in (3) above;

(7) a computer executable program comprising instructions which, when the program is executed by a computer, cause the computer to carry out the method of the encoding method revealed in (3) above; i.e. being the encoder of the encoding method revealed in (3) above;

(8) a computer executable program comprising instructions which, when the program is executed by a computer, cause the computer to carry out the method of the decoding method revealed in (4) above; i.e. being the decoder of the decoding method revealed in (4) above;

(9) A device comprising means configured for carrying out the encoding and/or the decoding method revealed in (3) and/or (4) above;

(10) The device of (9) above, wherein the device is connected over a local cloud, an internet cloud, a local area network, or internet; (11) A computer-readable storage medium having stored thereon the computer executable program comprising instructions which, when the program is executed by a computer, cause the computer to carry out the method of encoding and/or decoding revealed in (3) and/or (4) above; and

(12) A computer-readable storage medium having stored thereon the digital files containing the encoded code of the encoding method revealed in (3) above.

To recapitulate the essence of the represent invention, Diagram 1 shows the relationship between the piece of digital information under processing and check-sum(s):

Diagram 1

Relationship between digital information under processing and check-sum(s)

1111000010101110 . . .

A piece of digital information made of a series of binary bits of bit 1 and/or bit 0, the number of binary bits being the size of that piece of digital information

1001001111 . . .

One piece of check-sum generated according to the bit patterns of the above piece of digital and the corresponding standard used such as CRC, SHA256 or SHA512 and the like, the size of the digital information under processing must be bigger (i.e. longer) than all the piece(s) of check-sum(s) generated plus the number of binary bits used for header indicators The above Diagram 1 shows one piece of digital information of a certain size, the counting of the number of binary bits is in decimal number system; it also shows one piece of check-sum generated to represent that piece of digital information.

However, if the size of that piece of digital information has check-sum collisions, i.e. duplicate or multiple identical check-sums are found amongst all the unique bit patterns of digital information of that size, then more than one piece of check-sum or check-sum with Check-sum Index has to be used for correct identification and authentication for that particular piece of digital information with its unique bit pattern under processing as distinct from all other unqiue bit patterns of digital information of the same size.

However, the key missing piece of information is the size of digital information if just its corresponding check-sum(s) or together with CI is/are provided. So this piece of information has to be supplied. Diagram 2 shows the relationship between the size of digital information under processing and the size of which being represented in encoded code as follows:

Diagram 2

Relationship between digital information under processing and its representation in encoded code

1111000010101110

A piece of digital information made of a series of binary bits of bit 1 and/or bit 0, having 129 bits in decimal numeral system

10000000

The encoded code representing the size of the digital information under processing using base conversion Usually, the actual number of binary bits stored in a digital data file is counted in decimal number system. The decimal number can however be converted into a binary numeral system so that the actual number of binary bits used is much reduced. For example, if the size of digital information has 129 binary bits in decimal is converted to binary numeral system, 8 binary bits with the unique bit pattern of 10000000 (assuming 00000000 representing 1 in the decimal numeral system) are enough.

So now there should be two pieces of information, one piece being the number of binary bits in base-2 numeral system presenting the size of the digital information under processing and another piece of information consisting of one or more check-sum with or without check-sum index or indices as shown in Diagram 3 as follows:

Diagram 3

Encoded code presenting the size of digital information under processing and its corresponding check-sum representing the unique bit pattern of the digital information under processing

10000000

The encoded code representing the size of the digital information under processing using base conversion in Diagram 2; and after this piece is placed:

1001001111 the check-sum piece in Diagram 1

So the first piece of binary bits represents the size of digital information under processing and the second piece of binary bits represents the unique bit pattern of the digital information under processing of the size represented by the first piece.

However, the decoder has to know how many binary bits to read for the first piece and for the second piece of such information. For the second piece of information, header indicators could be used such as Bits for Types of Check-sum(s) Generated, Bit(s) for Number of Check-sum(s) Used, Number of Binary Bits Used By Check-sum Index for each check-sum used as revealed above in Paragraph [41](3). For the first piece of information, the scope of size of digital information under processing could be specified as explained in Paragraph [22] and as illustrated below in Diagram 4 as follows:

Diagram 4

Relationship between the encoded code for presenting the size of digital information under processing and the scope of the size of processing for digital information

00000

The scope of the size of processing, now represented by 5 binary bits, could be specified as header indicator or built into the program logic of the encoder as well as the decoder as the default value of the number of binary bits to be read for the scope of the size of processing.

10000000

The encoded code for presenting the size of digital information under processing as found in Diagram 2 and 3

The first piece of 5 binary bits in Diagram 4 above, 00000, represents 8 binary bits, i.e. the second piece of 10000000 is to be read. If the bit pattern of that 5 binary bits is 00001, then the number of binary bits to be read is 9 bits, representing the digital information under processing is of the size between 1 to 512 bits. So for the first piece of information in Diagram 4, the bit patterns ranging from 00000 to 11111, cover a scope of the size of processing from reading 8 bits to reading 39 bits, representing 0-256 bits to 0-5.497558e11 bits of digital information under processing.

The encoded code illustrated in Diagram 5 below shows the piece of information of the scope of the size of digital information under processing and the piece of information of the particular size of the digital information being under processing in binary numeral system:

Diagram 5

An example of encoded code without showing Header Indicators

00000

The first piece of binary bits in Diagram 4, to be followed by:

10000000

The second piece of binary bits in Diagram 4, to be followed by one or more pieces of check-sum(s) with or without check-sum index or indices, one piece of check-sum is shown below:

1001001111

The check-sum piece in Diagram 1 and Diagram 3

Using the Divide and Conquer Strategy and the corresponding technique (see Paragraphs [33] and [34]), assuming the size of the sub-sections to be broken is built into the program logic of the encoder and/or the decoder, if not using header indicator, is 129 binary bits of digital information, meaning each sub-section is of 129 binary bits of digital information composed of bit 1 and/or bit 0, then the encoded code is represented as in Diagram 6 below:

Diagram 6

Use of Divide and Conquer Strategy: An example of encoded code without showing Header Indicators

1001001111

One piece of check-sum above (or more to come, depending on the size of the whole digital information under processing and the number of check-sums used for each sub-section as indicated in header indicators) and another piece of check-sum as shown below:

1111001111 etc etc; and followed by:

1001

An Un-uncoded Code Section, if any, if not making up to the size of one sub-section of digital information under processing; the presence or non-presence of which is indicated using header indicator.

Industrial Applicability

There are numerous industrial applications that could use techniques revealed above in one way or another at an advantage, including all computer applications that process digital information, including all types of digital data, whether in random distribution or not, and in particular applications designed or having processes for the purpose of encoding and decoding for making data compression and data decompression. Such applications include user applications running in data centers such as video-conferencing, broadcasting multimedia digital files, applications managing data storage in data centers, cloud phones connecting to cloud data centers for their data processing and data storage, or even computer operating systems running over cloud data centers etc etc. With the advent of Supercomputing having tremendous speed superseding desktop computers or deployed in mobile phones, the aforesaid applications could spread to those platforms. Telecommunication companies could also benefit from transmitting digital information over networks using the method as well as the product of the present invention, as it help save a lot of network bandwidths, be it through cable or wireless.

Embodiments described herein may be implemented into a system using any suitably configured computer hardware and/or software. For example, certain embodiments may be implemented into a system using computer languages and compilers for making executable code and operating systems as well as applications or programs; the hardware of any device(s), whether networked or standalone, including computer system(s) or computer- controlled device(s) or operating- system-controlled device(s) or system(s), capable of running executable code; and computer-executable or operating-system-executable instructions or programs that help perform the steps for the methods described herein. In combination with the use of the technical features stated above, embodiments disclosed herein make possible the implementation of the present invention for processing of digital information, whether at random or not, through encoding and decoding losslessly and correctly the relevant digital data, including digital data and digital executable codes, for the purpose of compression and/or decompression; and in this relation, is characterized by the following claims:

Sequence List Text

The invention claimed is:

1. A method of data compression, the method comprising: encoding digital information composed of binary bits made up of one or both of bit 1 and bit 0, using header indicators, size of digital information under processing, one or more check-sums with or without check-sum index or indices where and when appropriate for data identification and authentication.

2. A method of data compression, the method comprising: decoding digital information composed of binary bits made up of one or both of bit 1 and bit 0, using header indicators, size of digital information under processing, one or more check-sums with or without check-sum index or indices where and when appropriate for data identification and authentication.

3. A method of encoding for data compression performed by an encoder that is a program or application performable by a computer, the method comprising:

counting the size of the digital information under processing measured in terms of the decimal number of binary bits in the form of a series of one or both of bit 1 and bit 0 within the scope of processing according to design;

representing the counted size of the digital information under processing, in the form of encoded code of binary bits of base-2 numeral system or the like, using base conversion resulting in saving in bit storage and putting the encoded code into corresponding digital file if such information has not been embedded in the encoder;

representing, according to the scope of processing designed for the range of size of digital information under processing, the range of size using binary bits of base-2 numeral system or the like as encoded code and putting the encoded code into corresponding digital file if such information has not been embedded as program logic in the encoder;

for purpose of data identification and data authentication one or more check-sums or check- sum(s) together with check-sum index or check-sum indices if used where and when appropriate for the whole digital information under processing or for each of the sub-sections divided out of and making up the whole digital information under processing; and putting such check-sum(s) or check-sum(s) together with check-sum index or check-sum indices if used (and for the latter case where the whole digital information is divided into sub-section(s) also putting any binary bits, which are smaller than the size of a sub-section, left un-encoded making up the Un-encoded Section and generating the corresponding header indicator for it where and when appropriate) as encoded code, which is then put into the corresponding digital file(s) for the encoding process as appropriate and according to design; and generating one or more header indicators of the following, including un-encoded sub-section bit, recycle bit, compression cycles bits, bits for types of check-sums generated, bits for number of check- sums used, number of binary bits used by check-sum index for each check-sum used as appropriate for use and putting such indicator(s) as encoded code, which is then put into corresponding digital file(s) if such information has not been embedded in the encoder as appropriate and according to design.

4. A device comprising means for performing the encoding method of claim 3.

5. The device of claim 4, including means for connecting the device over a local cloud, an internet cloud, a local area network, or internet.

6. A computer executable program comprising instructions which, when the program is executed by a computer, cause the computer to carry out the method of the encoding method of claim 3.

7. A non-transitory computer-readable storage medium having stored thereon computer executable program instructions which, when executed by a computer, cause the computer to perform the method of claim 3.

8. A method of decoding for data decompression performed by a decoder that is a program or application performable by a computer, the method comprising:

retrieving the scope of processing for the range of size of digital information under processing from the corresponding digital file or from program logic;

reading the represented size of the digital information under processing from the corresponding digital file or retrieving it from program logic, converting the represented size of the digital information under processing into counted size for use if necessary or appropriate;

retrieving, for the purpose of data identification and data authentication, from the corresponding digital file(s), one or more check-sums or check-sum(s) together with check-sum index or check-sum indices if used where and when appropriate for the whole digital information under processing or for each of the sub-sections divided out of and making up the whole digital information under processing;

retrieving, from the corresponding digital file(s) or from program logic, header indicators, including un-encoded sub-section bit, recycle bit, compression cycles bits, bits for types of check-sums generated, bits for number of check-sums used, number of binary bits used by check-sum index for each check-sum used as appropriate; and converting the retrieved piece(s) of digital information and restoring them back into the corresponding piece(s) of the original digital information as it is before the encoding process by, for purpose of data identification and data authentication, generating according to the header indicators indicating, one or more check-sums or check-sum(s) together with check-sum index or check- sum indices if used where and when appropriate for each of the unique bit patterns of the size of digital information corresponding to that particular size of the whole digital information under processing or for each of the unique bit patterns of the size of digital information corresponding to that particular size of the sub-sections divided out of and making up the whole digital information under processing; and then identifying the one which has exact match of check-sum(s) with or without check-sum index or indices corresponding to the corresponding unique bit pattern of the retrieved digital information for the authentication of the whole digital information under processing or identifying the one which has exact match of check-sum(s) with or without check-sum index or indices corresponding to the unique bit pattern of each of the sub-sections divided out of and making up the whole digital information under processing for the authentication of each of the corresponding sub-sections; and putting the corresponding unique bit pattern of the whole digital information with exact match under processing or the corresponding unique bit pattern of each of the sub-sections divided out of and making up the whole digital information with exact match under processing (and for the latter case, putting also any binary bits left un-encoded in the un-encoded section as indicated by the corresponding header indicator where and when appropriate) as decoded code into corresponding digital file(s) according to design.

9. A computer executable program comprising instructions which, when the program is executed by a computer, cause the computer to carry out the method of the decoding method of claim 8.

10. A device comprising means for performing the decoding method of claim 8.

11. The device of claim 10, including means for connecting the device over a local cloud, an internet cloud, a local area network, or internet.

12. A non-transitory computer-readable storage medium having stored thereon computer executable program instructions which, when executed by a computer, cause the computer to perform the method of claim 8.

* * * * *